United States Patent
Kim et al.

(10) Patent No.: US 12,283,510 B2
(45) Date of Patent: Apr. 22, 2025

(54) SUBSTRATE TREATING APPARATUS AND SUBSTRATE TREATING METHOD USING THE SAME

(71) Applicant: SEMES CO., LTD., Chungcheongnam-do (KR)

(72) Inventors: Sang Oh Kim, Seoul (KR); Myung Jin Lee, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 325 days.

(21) Appl. No.: 17/747,914

(22) Filed: May 18, 2022

(65) Prior Publication Data

US 2023/0163009 A1    May 25, 2023

(30) Foreign Application Priority Data

Nov. 23, 2021   (KR) .......................... 10-2021-0162028

(51) Int. Cl.
*H01L 21/68*    (2006.01)
*B65G 47/90*    (2006.01)
(Continued)

(52) U.S. Cl.
CPC ............ *H01L 21/681* (2013.01); *B65G 47/90* (2013.01); *H01L 21/67742* (2013.01); *H01L 21/68707* (2013.01)

(58) Field of Classification Search
CPC ............ H01L 21/67259; H01L 21/677; H01L 21/67742; H01L 21/67748;
(Continued)

(56) References Cited

U.S. PATENT DOCUMENTS 6,816,755 B2 * 11/2004 Habibi .................. B25J 9/1697
                                                                    901/42
8,135,208 B1 *  3/2012 Vangal-Ramamurthy ...................
                                                                     G06T 7/80
                                                                      700/254

(Continued)

FOREIGN PATENT DOCUMENTS

CN        111902245 A  * 11/2020  .......... B25J 11/0095
JP        2008-251968      10/2008
(Continued)

OTHER PUBLICATIONS

"Align." Merriam-Webster.com Dictionary, Merriam-Webster, https://www.merriam-webster.com/dictionary/align. Accessed Jun. 3, 2024. (Year: 2024).*

(Continued)

*Primary Examiner* — Adam R Mott
*Assistant Examiner* — James Miller Watts, III
(74) *Attorney, Agent, or Firm* — WOMBLE BOND DICKINSON (US) LLP

(57) ABSTRACT

The present disclosure provides a substrate treating apparatus having improved efficiency and productivity. The substrate treating apparatus of the present disclosure comprises a process chamber having a treating space therein, a transfer robot comprising a robot hand for loading and unloading a substrate into and out of the treating space and gripping the substrate, and a teaching buffer for aligning the robot hand, wherein the teaching buffer comprises a teaching plate for providing a reference point, and at least one camera looking at the teaching plate, wherein the camera captures the reference point of the teaching plate, wherein the transfer robot aligns the robot hand with the reference point using the camera.

18 Claims, 12 Drawing Sheets

(51) Int. Cl.
*H01L 21/677* (2006.01)
*H01L 21/687* (2006.01)

(58) Field of Classification Search
CPC ............ H01L 21/67766; H01L 21/681; H01L 21/68707; B65G 47/90; B25J 9/1692; B25J 9/1697

See application file for complete search history.

(56) References Cited

U.S. PATENT DOCUMENTS

| | | | |
|---|---|---|---|
| 11,037,810 | B2 | 6/2021 | Mochizuki |
| 2003/0202092 | A1* | 10/2003 | Sadighi ............... B25J 9/1697 348/87 |
| 2003/0231950 | A1* | 12/2003 | Raaijmakers ......... H01L 21/681 414/935 |
| 2004/0202362 | A1* | 10/2004 | Ishikawa .............. H01L 21/681 382/153 |
| 2014/0100694 | A1* | 4/2014 | Rueckl ................. B25J 9/1692 700/254 |
| 2017/0028560 | A1* | 2/2017 | Senn ..................... H01L 21/682 |
| 2019/0172742 | A1* | 6/2019 | Mochizuki ........... H01L 21/681 |

FOREIGN PATENT DOCUMENTS

| | | | |
|---|---|---|---|
| JP | 2019-102728 | 6/2019 | |
| KR | 10-2003-0096318 | 12/2003 | |
| KR | 10-2007-0109447 | 11/2007 | |
| KR | 10-1409752 | 7/2014 | |
| KR | 10-2019-0016695 | 2/2019 | |
| KR | 10-1971824 | 4/2019 | |
| WO | WO-2021022291 A1 * | 2/2021 | ............ B25J 9/1692 |

OTHER PUBLICATIONS

Saraliev, D. P. (2005). Calibration of a six-axis wafer transport robot (Order No. 29704319). Available from ProQuest Dissertations and Theses Professional. (2711779264). Retrieved from https://dialog.proquest.com/professional/docview/2711779264?accountid=131444 (Year: 2005).*

Translation of CN-111902245-A (Year: 2020).*

Office Action dated Jul. 12, 2023 for Korean Patent Application No. 10-2021-0162028 and its English translation by Google Translate.

* cited by examiner

SUBSTRATE TREATING APPARATUS AND SUBSTRATE TREATING METHOD USING THE SAME

This application claims the benefit of Korean Patent Application No. 10-2021-0162028, filed on Nov. 23, 2021, in the Korean Intellectual Property Office, the disclosure of which is incorporated herein by reference in its entirety.

BACKGROUND

1. Field

The present disclosure relates to a substrate treating apparatus and a substrate treating method using the same.

2. Description of the Related Art

In order to manufacture a semiconductor device, a substrate is treated through various processes such as photolithography, etching, ashing, ion implantation, thin film deposition, and cleaning to form a desired pattern on the substrate.

In order to perform the above process, the substrate should be transferred to each process chamber. Specifically, a transfer robot capable of transferring the substrate transfers the substrate to each chamber. In this case, the transfer robot should be aligned to precisely move the substrate to a desired position. Controlling and aligning the robot hand with the naked eye can be time consuming.

SUMMARY

The technical object of the present disclosure is to provide a substrate treating apparatus with improved efficiency and productivity.

Another technical object of the present disclosure is to provide a substrate treating method with improved efficiency and productivity.

The objects of the present disclosure are not limited to the objects mentioned above, and other objects not mentioned will be clearly understood by those skilled in the art from the following description.

A substrate treating apparatus according to an aspect of the present disclosure for achieving the above technical object comprises a process chamber having a treating space therein, a transfer robot comprising a robot hand for loading and unloading a substrate into and out of the treating space and gripping the substrate, and a teaching buffer for aligning the robot hand, wherein the teaching buffer comprises a teaching plate for providing a reference point, and at least one camera looking at the teaching plate, wherein the camera captures the reference point of the teaching plate, wherein the transfer robot aligns the robot hand with the reference point using the camera.

In some embodiments, the robot hand comprises an alignment mark disposed at a distal end of the robot hand, and the teaching buffer compares the alignment mark with the reference point to align the robot hand In some embodiments, the alignment mark is aligned with a center point of the substrate.

In some embodiments, the reference point is captured at a first position, and the robot hand is aligned in the first position.

In some embodiments, a height between the teaching plate and the camera is the same as a height between the robot hand and the camera.

In some embodiments, the camera comprises a prism method.

In some embodiments, the camera comprises a first camera and a second camera spaced apart from each other.

In some embodiments, the reference point comprises a first reference point and a second reference point spaced apart from each other, and the first camera captures the first reference point, and the second camera captures the second reference point.

In some embodiments, the robot hand comprises a first hand and a second hand spaced apart from each other, and the first hand is aligned with the first reference point and the second hand is aligned with the second reference point.

A substrate treating apparatus according to another aspect of the present disclosure for achieving the above technical object comprises a process chamber having a treating space therein, a transfer robot comprising a robot hand for loading and unloading a substrate into and out of the treating space and gripping the substrate, and a teaching buffer for aligning the first hand and second hand, wherein the teaching buffer comprises a teaching plate for providing a first reference point and a second reference point, a first camera for capturing the first reference point and a second camera for capturing the second reference point, wherein the transfer robot aligns the first hand using the first reference point and aligns the second hand using the second reference point.

In some embodiments, the first hand comprises a first alignment mark disposed at a distal end of the first hand, and the first hand is aligned by comparing the first alignment mark with the first reference point.

In some embodiments, a height between the first camera and the first reference point is the same as a height between the first hand and the first camera, and a height between the second camera and the second reference point is the same as a height between the second camera and the second hand.

In some embodiments, a first vertical position, at which the first and second reference points are captured, and a second vertical position, at which the first and second hands are aligned, are the same as each other.

In some embodiments, the camera comprises a prism method.

A substrate treating method according to an aspect of the present disclosure for achieving the above technical object comprises loading a teaching plate comprising a reference point into a teaching buffer, capturing the reference point using a camera disposed in an upper portion of the teaching plate, loading a robot hand comprising an alignment mark into the teaching buffer, and aligning the robot hand by comparing the reference point and the alignment mark, wherein the robot hand grips a substrate to load and unload the substrate into and out of a process chamber.

In some embodiments, the alignment mark is aligned with a center point of the substrate.

In some embodiments, a position, at which the teaching plate is loaded, and a position, at which the robot hand is loaded, are the same as each other.

In some embodiments, the camera comprises a first camera and a second camera spaced apart from each other, the reference point comprises a first reference point and a second reference point spaced apart from each other, and the first camera captures the first reference point, and the second camera captures the second reference point.

In some embodiments, the robot hand comprises a first hand and a second hand spaced apart from each other, and the first hand is aligned with the first reference point and the second hand is aligned with the second reference point.

In some embodiments, the camera comprises a prism method.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
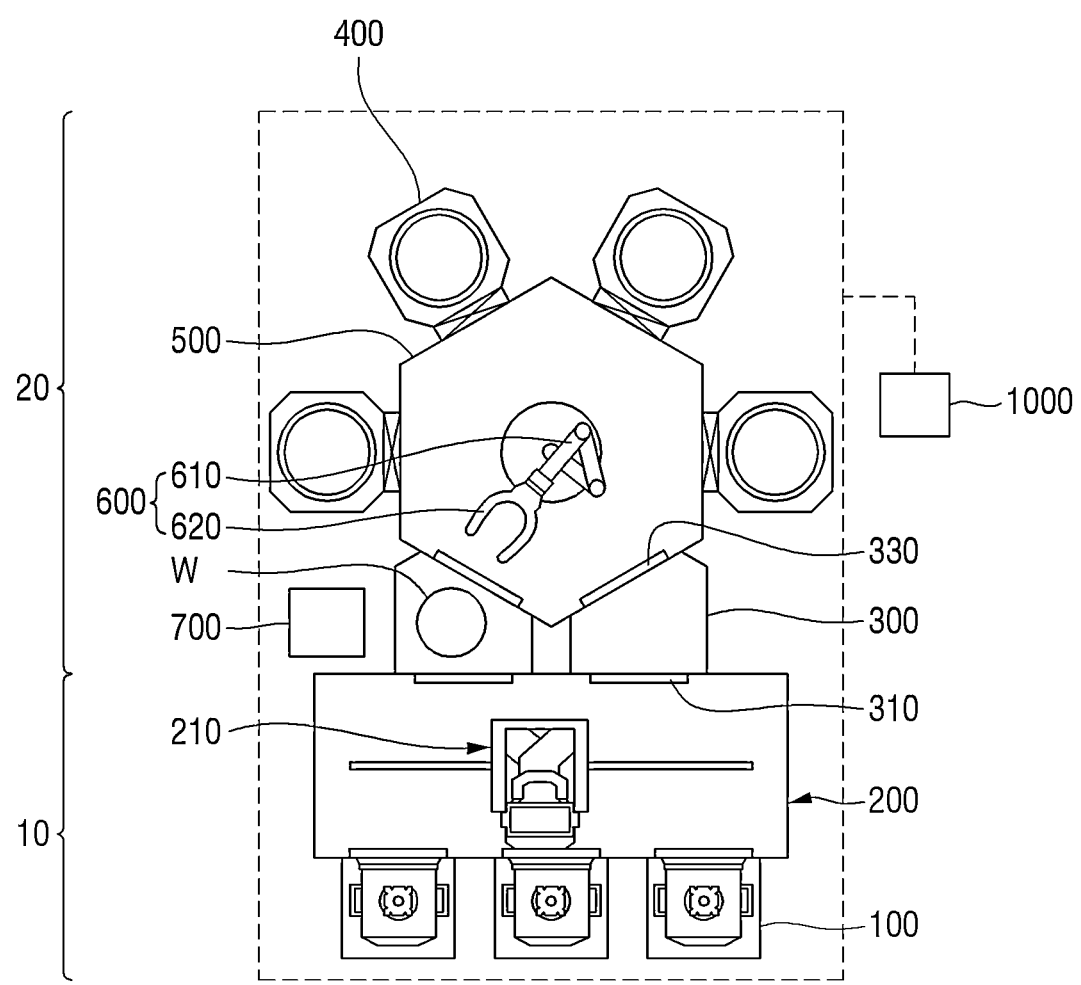
FIG. 1 is a plan view schematically illustrating a substrate treating apparatus according to some embodiments of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present invention belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

Hereinafter, a substrate treating apparatus according to some embodiments of the present disclosure will be described with reference to FIGS. 1 to 4.

FIG. 1 is a plan view schematically illustrating a substrate treating apparatus according to some embodiments of the present disclosure.

Referring to FIG. 1, a substrate treating apparatus according to some embodiments includes an equipment front end module 10 and a process module 20. The equipment front end module 10 may be disposed at one side of the process module 20. For example, the equipment front end module 10 may be disposed in front of the process module 20. The equipment front end module 10 may include a plurality of load ports 100 and an index module 200. The process module 20 may include a load lock chamber 300, a process chamber 400, a transfer chamber 500, a transfer robot 600, and a teaching buffer 700.

The index module 200 is disposed between the load port 100 and the process module 20. The index module 200 transfers the substrate W between the load port 100 and the process module 20. Each load port 100 provides a space, in which the container (FOUP), in which the substrate W is stored, is placed. The index module 200 may include an index robot 210. The index robot 210 may unload and transfer the substrate W before processing from the container (FOUP) placed on the load port 100 to the process module 20. Also, the index robot 210 may load the processed substrate W from the process module 20 into the container (FOUP).

The process module 20 may include a transfer chamber 500, a plurality of load lock chambers 300, and a plurality of process chambers 400. The transfer chamber 500 may have a polygonal shape in a plan view. A load lock chamber 300 and a process chamber 400 may be disposed at each corner of the transfer chamber 500. The load lock chamber 300 may be disposed at a position closest to the equipment front end module 10 among the corners of the transfer chamber 500.

For example, the transfer chamber 500 may have a hexagonal shape in a plan view. The transfer chamber 500 may have six corners. Four process chambers 400 and two load lock chambers 300 may be disposed at each corner. However, the technical spirit of the present disclosure is not limited thereto. Of course, the shape of the transfer chamber 500 and the number of the process chambers 400 and the load lock chambers 300 disposed adjacent to the transfer chamber 500 may be changed.

The transfer robot 600 may be disposed inside the transfer chamber 500. The transfer robot 600 transfers the substrate W between the load lock chamber 300 and the process chamber 400. The transfer robot 600 may include a robot arm 610 and a robot hand 620. The robot hand 620 may grip the substrate W. The robot arm 610 can move in the x-axis, y-axis, and z-axis. In some embodiments, the transfer robot 600 may align the robot hand 620 using the camera 720 of the teaching buffer 700.

The load lock chamber 300 provides a space for temporarily storing the substrate W loaded into or unloaded out of the process module 20. The inside of the load lock chamber 300 may be convertible to vacuum and atmospheric pressure. Accordingly, the inside of the transfer chamber 500 and the process chamber 400 may be maintained in a vacuum, and the inside of the equipment front end module 10 may be maintained at atmospheric pressure. A first gate valve 310 is installed between the load lock chamber 300 and the equipment front end module 10. A second gate valve 330 is installed between the load lock chamber 300 and the transfer chamber 500. Any one of the first gate valve 310 and the second gate valve 330 may be open so that a vacuum inside the transfer chamber 500 and the process chamber 400 is maintained.

The process chamber 400 performs a process of treating the substrate W. The process chamber 400 may include a treating space therein. For example, the process chamber 400 may perform at least one of an etching process, a photo process, and a developing process, but is not limited thereto.

In some embodiments, the substrate treating apparatus may further include a control module 1000. The control module 1000 may control the transfer chamber 500, the load lock chamber 300, the process chamber 400, the transfer robot 600, and the teaching buffer 700. Also, the control module 1000 may control the transfer robot 600 to transfer the substrate W. The control module 1000 may control aligning the transfer robot 600 using the teaching buffer 700, but is not limited thereto.

The teaching buffer 700 may be disposed outside the transfer chamber 500 or may be disposed inside the transfer chamber 500. The teaching buffer 700 may be used to automatically align the robot hand 620 of the transfer robot 600. A detailed description of the teaching buffer 700 will be described with reference to FIG. 2.

Figure 2:
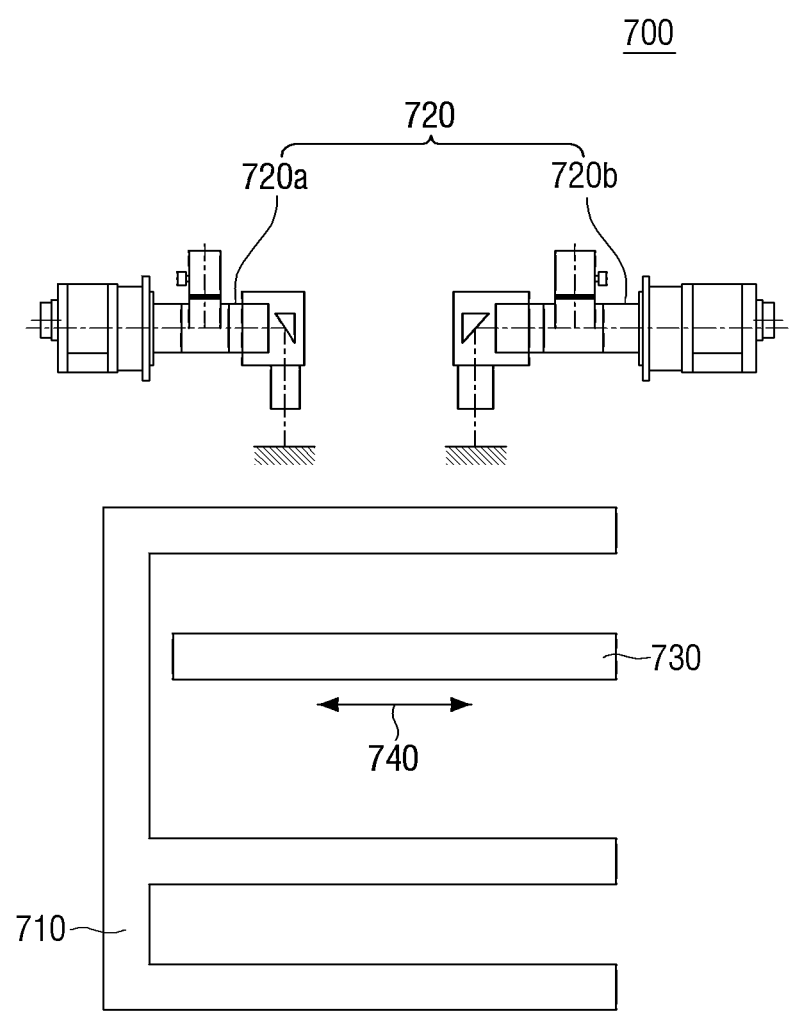
FIG. 2 is an exemplary diagram for describing the teaching buffer of FIG. 1.
Figure 3:
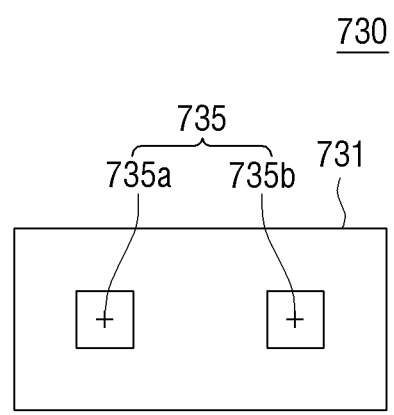
FIG. 3 is an exemplary plan view for describing the teaching plate of FIG. 2.

FIG. 2 is an exemplary diagram for describing the teaching buffer of FIG. 1. FIG. 3 is an exemplary plan view for describing the teaching plate of FIG. 2.

Referring to FIGS. 2 and 3, the teaching buffer 700 may include a buffer body 710, a camera 720, and a teaching plate 730.

The camera 720 may be disposed on the buffer body 710. The camera 720 may look at the teaching plate 730. The camera 720 may capture the reference point 735 of the teaching plate 730. The camera 720 may include a prism method, but is not limited thereto.

In some embodiments, at least one or more cameras 720 may be included. The camera 720 may include, for example, a first camera 720*a* and a second camera 720*b*. The first camera 720*a* and the second camera 720*b* may be spaced apart from each other. The first camera 720*a* and the second camera 720*b* may capture the first reference point 735*a* and the second reference point 735*b*, respectively. The camera 720 may generate an image by capturing the reference point 735 of the teaching plate 730. The camera 720 may generate reference coordinates by capturing the reference point 735.

The teaching plate 730 may be disposed inside the buffer body 710. The teaching plate 730 may be loaded into the buffer body 710 and unloaded (see reference numeral 740). For example, when the camera 720 captures the teaching plate 730, the teaching plate 730 may be loaded into the buffer body 710. When the camera 720 aligns the robot hand (620 in FIG. 1), the teaching plate 730 may be unloaded from the buffer body 710.

The teaching plate 730 may include a plate 731 and a reference point 735. The reference point 735 may be located on the plate 731. The reference point 735 may be a reference point used when aligning the robot hand (620 of FIG. 1). The reference point 735 may include at least one or more. For example, the reference point 735 may include a first reference point 735*a* and a second reference point 735*b*. However, the technical spirit of the present disclosure is not limited thereto.

Figure 4:
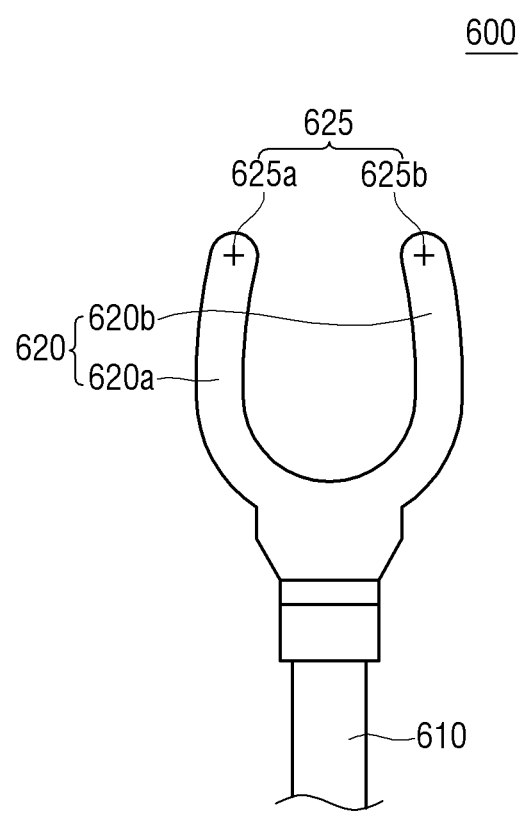
FIG. 4 is an exemplary view for describing the work robot of FIG. 1.

In some embodiments, the first reference point 735*a* may be used to align the first hand (620*a* in FIG. 4). The second reference point 735*b* may be used to align the second hand (620*b* in FIG. 4). The first reference point 735*a* may correspond to the first alignment mark (625*a* of FIG. 4). The second reference point 735*b* may correspond to the second alignment mark (625*b* of FIG. 4).

FIG. 4 is an exemplary view for describing the work robot of FIG. 1. The transfer robot 600 will be described in more detail with reference to FIG. 4.

Referring to FIG. 4, the transfer robot 600 includes a robot arm 610 and a robot hand 620. The robot hand 620 may be a part that grips the substrate (W in FIG. 1). The robot arm 610 may be an arm that moves the robot hand 620 and the substrate W.

The robot hand 620 may include, for example, a first hand 620*a* and a second hand 620*b*. The first hand 620*a* and the second hand 620*b* may be spaced apart from each other. Each of the robot hands 620 includes an alignment mark 625. The alignment mark 625 may be a mark used to align the robot hand 620. For example, the camera of the teaching buffer (720 in FIG. 2) captures the reference point (735 in FIG. 3) of the teaching plate, and compares the captured reference point with the alignment mark 625 to align the robot hand 620. The alignment method of the robot hand 620 will be described later in detail with reference to FIGS. 5 to 12.

The alignment mark 625 includes a first alignment mark 625*a* and a second alignment mark 625*b*. A first alignment mark 625*a* is formed on the first hand 620*a*. A second alignment mark 625*b* is formed on the second hand 620*b*. The first alignment mark 625*a* may be used to align the first hand 620*a*. The second alignment mark 625*b* may be used to align the second hand 620*b*. However, the technical spirit of the present disclosure is not limited thereto.

In some embodiments, the alignment mark 625 may be aligned with a center point of the substrate, but is not limited thereto. In some embodiments, alignment marks 625 are shown as having a cross shape, but are not limited thereto.

Hereinafter, a method of operating a substrate treating apparatus and a substrate treating method according to some exemplary embodiments will be described.

Figure 5:
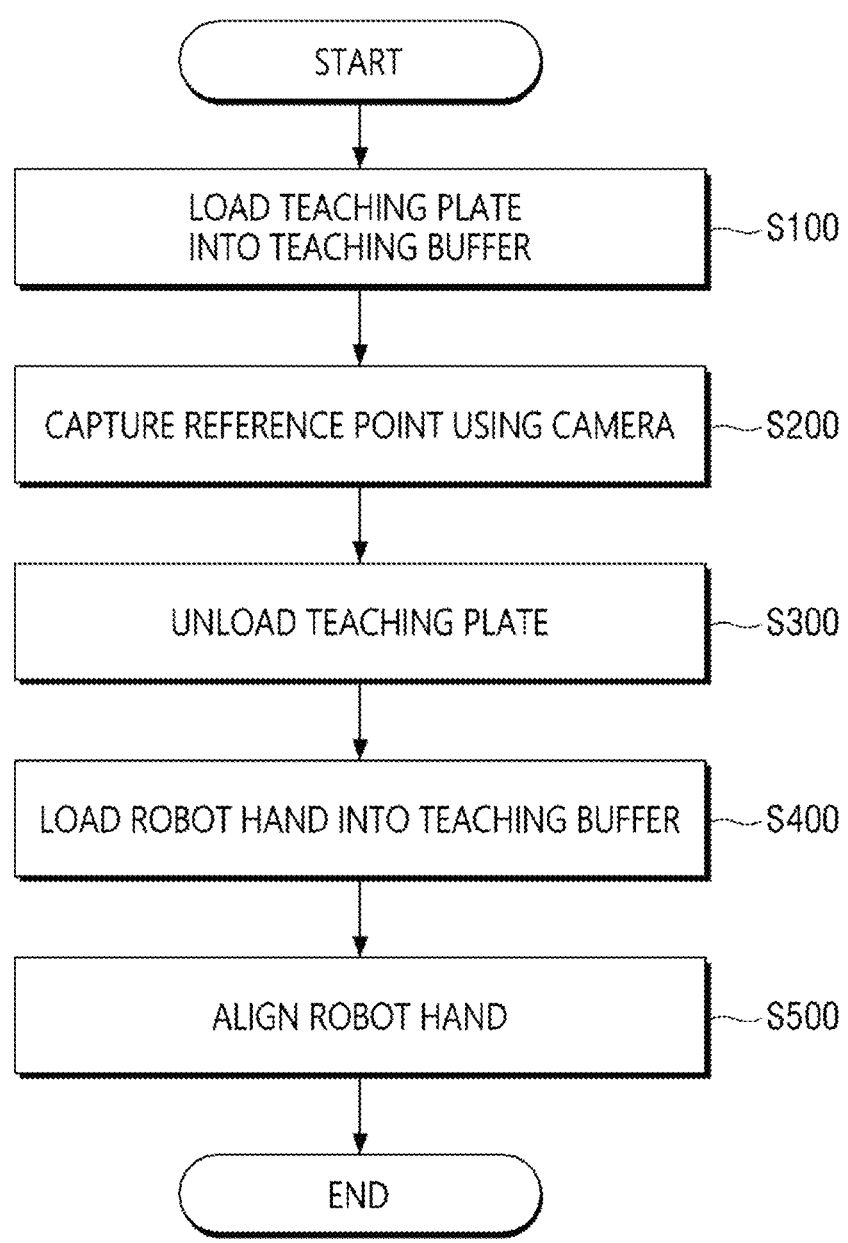
FIG. 5 is an exemplary flowchart for describing a method for treating a substrate according to some embodiments.

FIG. 5 is an exemplary flowchart for describing a method for treating a substrate according to some embodiments.

Referring to FIG. 5, the substrate treating method according to some embodiments includes loading a teaching plate into a teaching buffer (S100), capturing a reference point using a camera (S200), unloading the teaching plate (S300), loading the robot hand into the teaching buffer (S400), and aligning the robot hand (S500). Each step will be described with reference to FIGS. 6 to 12.

Figure 6:
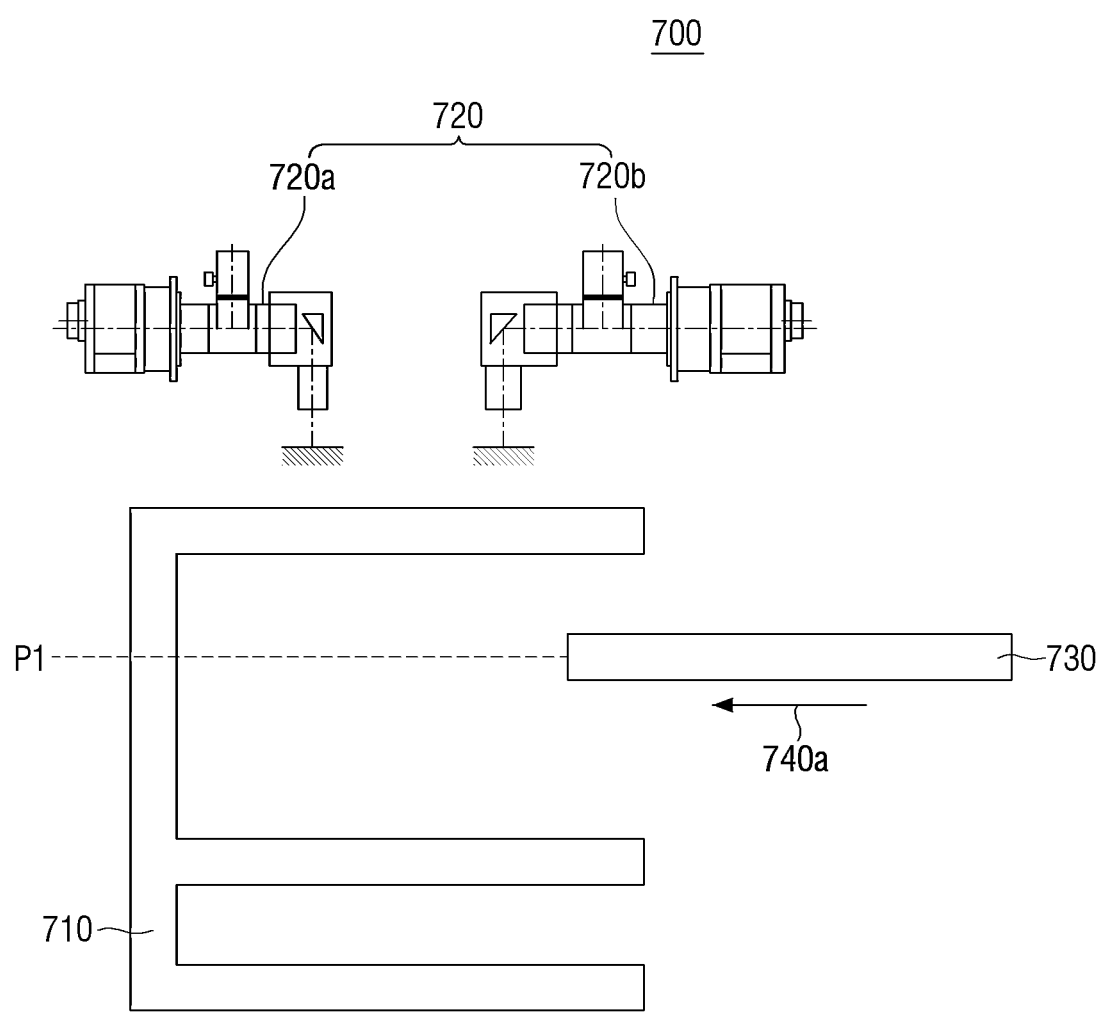
FIG. 6 is a diagram for describing step S100 of FIG. 5.

FIG. 6 is a diagram for describing step S100 of FIG. 5.

Referring to FIGS. 5 and 6, the teaching plate 730 may be loaded into the buffer body 710 (see reference numeral 740a). The teaching plate 730 may be loaded to a position overlapping the camera 720 in the vertical direction. The teaching plate 730 may be loaded at the first vertical position P1.

Figure 7:
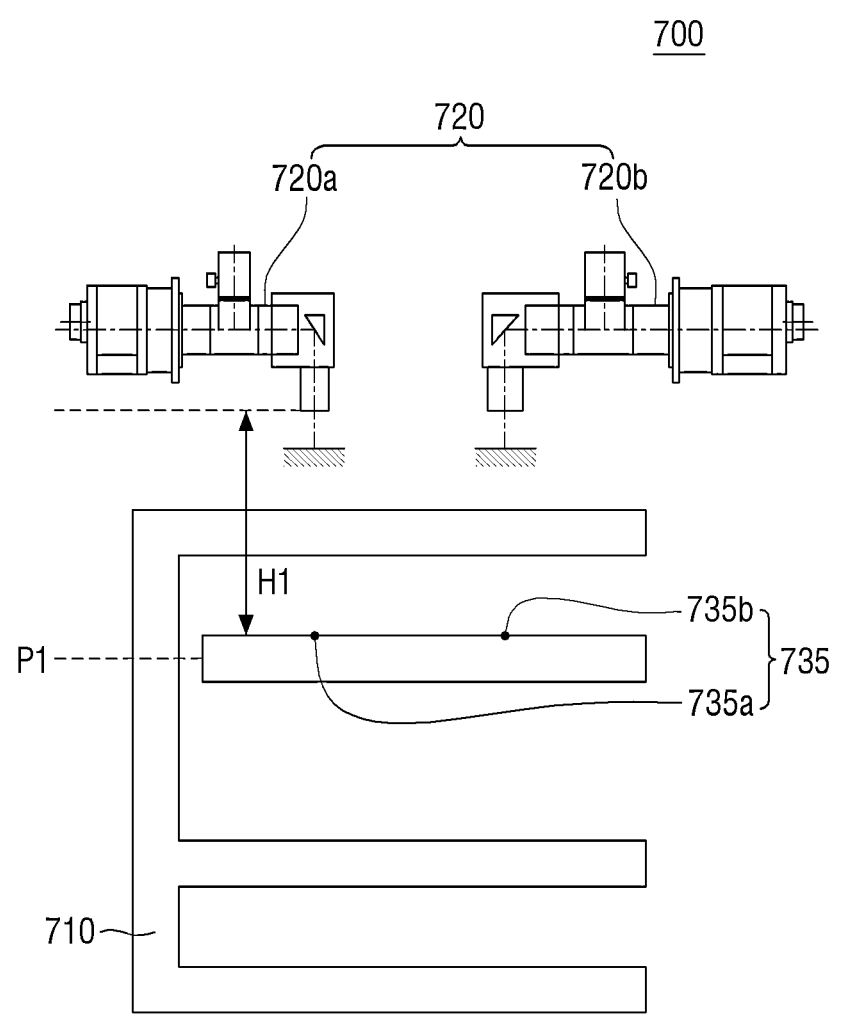
FIGS. 7 and 8 are diagrams for describing step S200 of FIG. 5.
Figure 8:
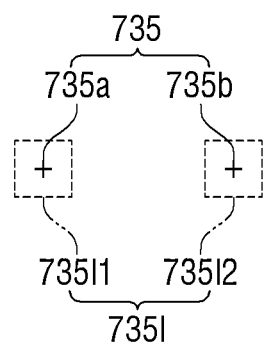

FIGS. 7 and 8 are diagrams for describing step S200 of FIG. 5.

Referring to FIGS. 5 and 7, the teaching plate 730 may be loaded at a position overlapping the camera 720 in the vertical direction. The reference point 735 of the teaching plate 730 may vertically overlap the camera 720. For example, the first camera 720a may vertically overlap the first reference point 735a, and the second camera 720b may vertically overlap the second reference point 735b.

The teaching plate 730 may be loaded in the first vertical position P1. A vertical height between the camera 720 and the teaching plate 730 may be a first height H1. A vertical height between the first camera 720a and the first reference point 735a may be the first height H1. The vertical height between the second camera 720b and the second reference point 735b may be the first height H1.

Subsequently, referring to FIGS. 5 and 8, the camera 720 may capture the reference point 735 of the teaching plate 730 (S200).

The camera 720 may generate an image 735I by capturing the reference point 735. For example, the first camera 720a may generate a first image 735I1 by capturing the first reference point 735a. The second camera 720b may generate a second image 735I2 by capturing the second reference point 735b.

The camera 720 may generate reference coordinates by capturing the reference point 735. For example, the first camera 720a may generate first reference coordinates by capturing the first reference point 735a. The second camera 720b may generate second reference coordinates by capturing the second reference point 735b. For example, the first reference coordinates may be (0,0). The second reference coordinates may be (1,0).

Figure 9:
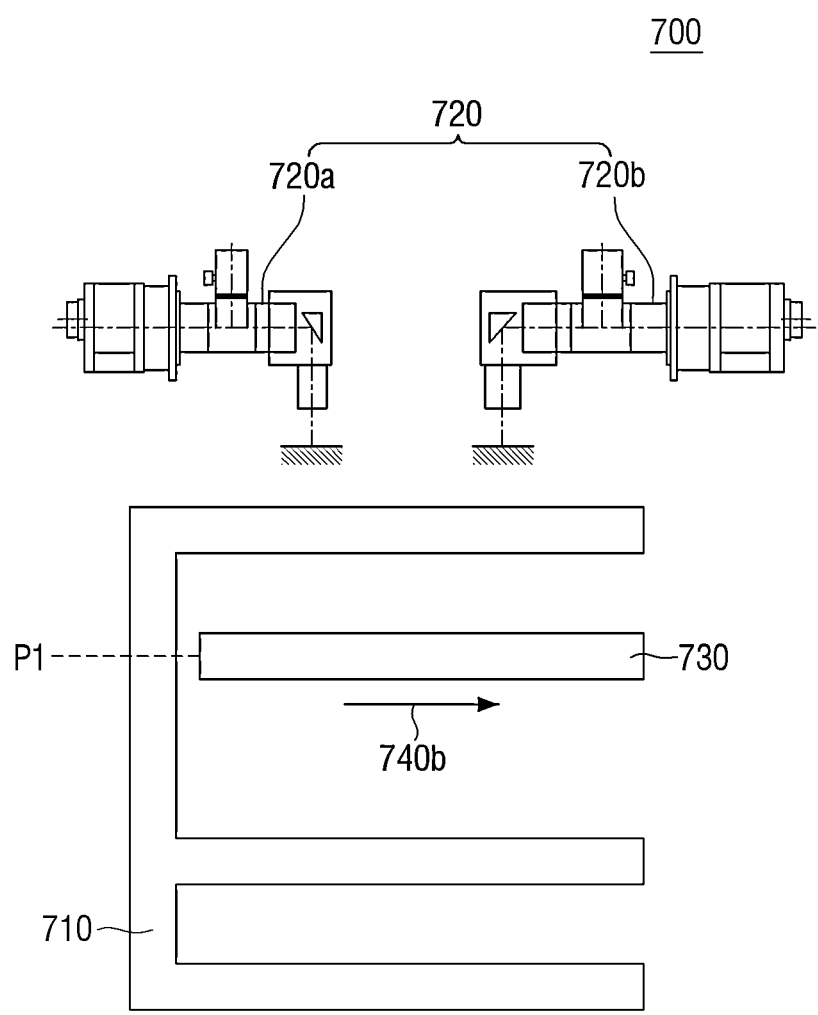
FIG. 9 is a diagram for describing step S300 of FIG. 5.

FIG. 9 is a diagram for describing step S300 of FIG. 5.

Referring to FIGS. 5 and 9, the teaching plate 730 may be unloaded from the buffer body 710 (S300). The teaching plate 730 may be unloaded in a direction opposite to the loaded direction (see reference numeral 740b). However, the technical spirit of the present disclosure is not limited thereto.

Figure 10:
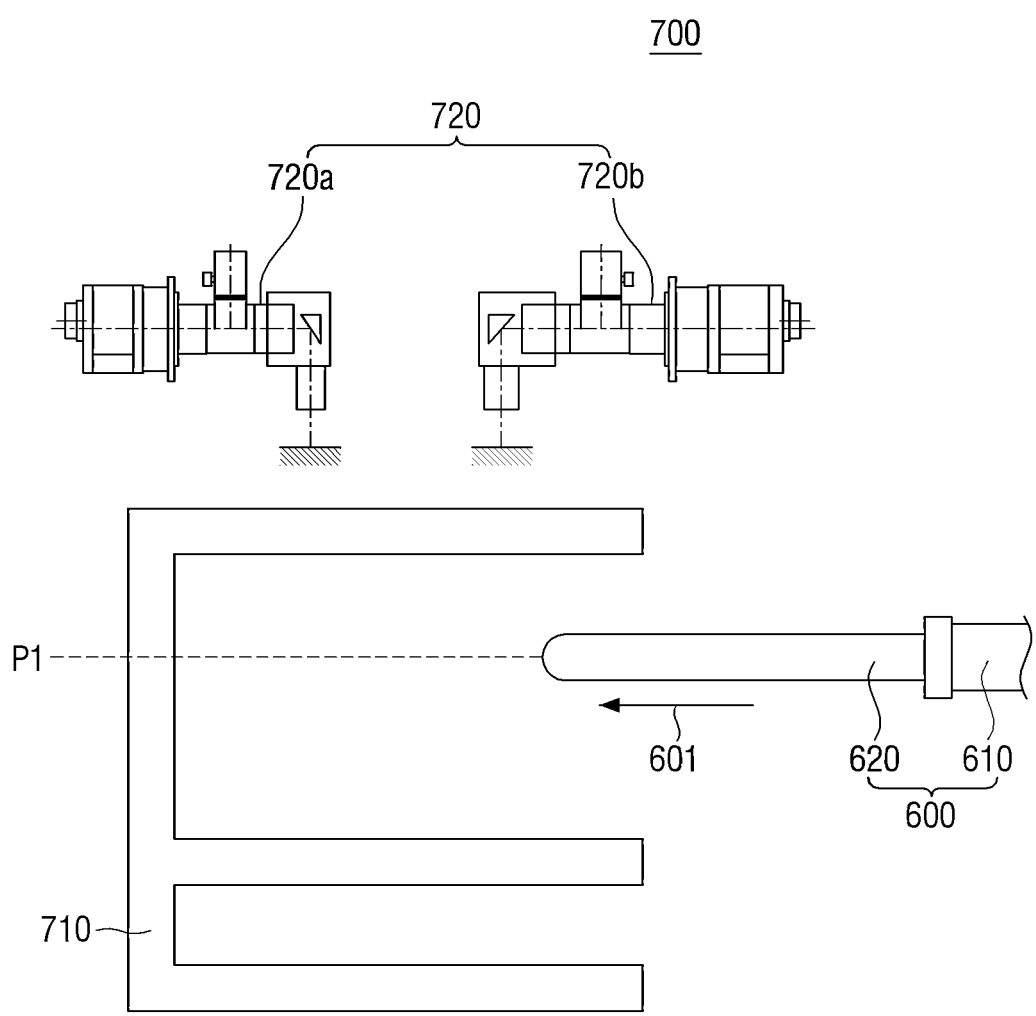
FIG. 10 is a diagram for describing step S400 of FIG. 5.

FIG. 10 is a diagram for describing step S400 of FIG. 5.

Referring to FIGS. 5 and 10, the robot hand 620 may be loaded into the teaching buffer 700 (S400).

The robot hand 620 may be loaded at the first vertical position P1 (see reference numeral 601). The vertical position, at which the robot hand 620 is loaded into the teaching buffer 700, may be the same as the vertical position, at which the teaching plate 730 is loaded into the buffer body 710. That is, a position for forming reference coordinates by capturing the reference point 735 and a position for aligning the robot hand 620 may be the same. Due to this, the robot hand 620 can be more accurately aligned.

Figure 11:
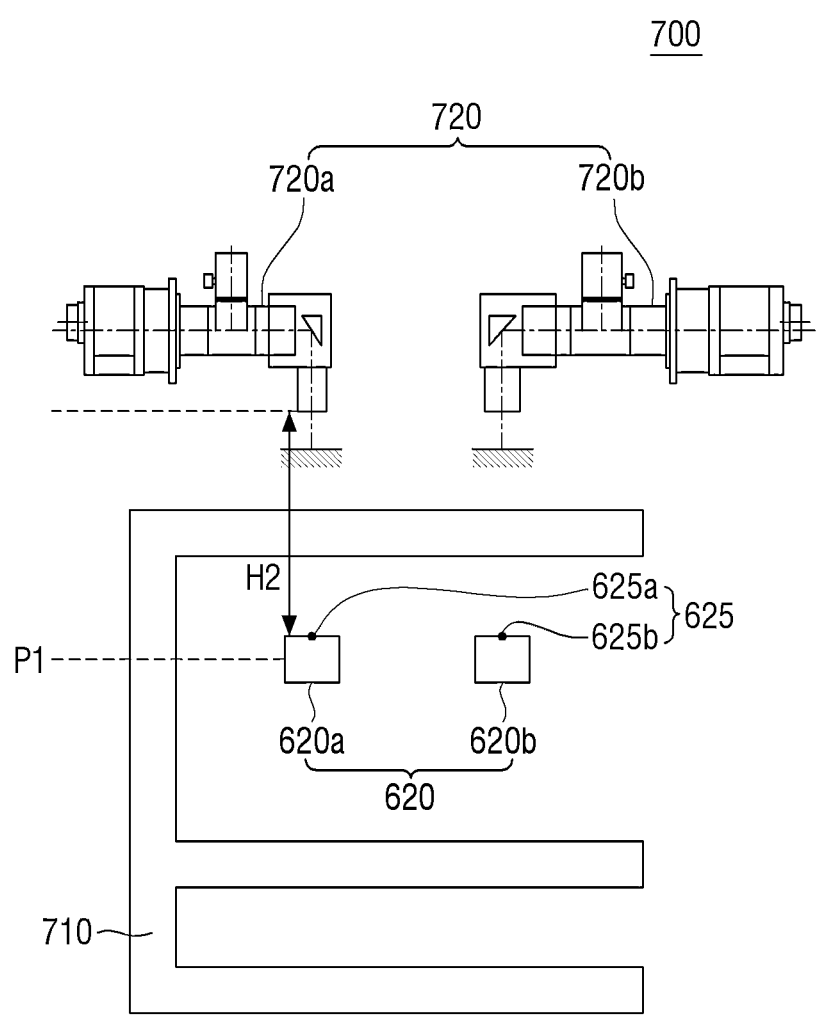
FIGS. 11 and 12 are diagrams for describing step S500 of FIG. 5.
Figure 12:
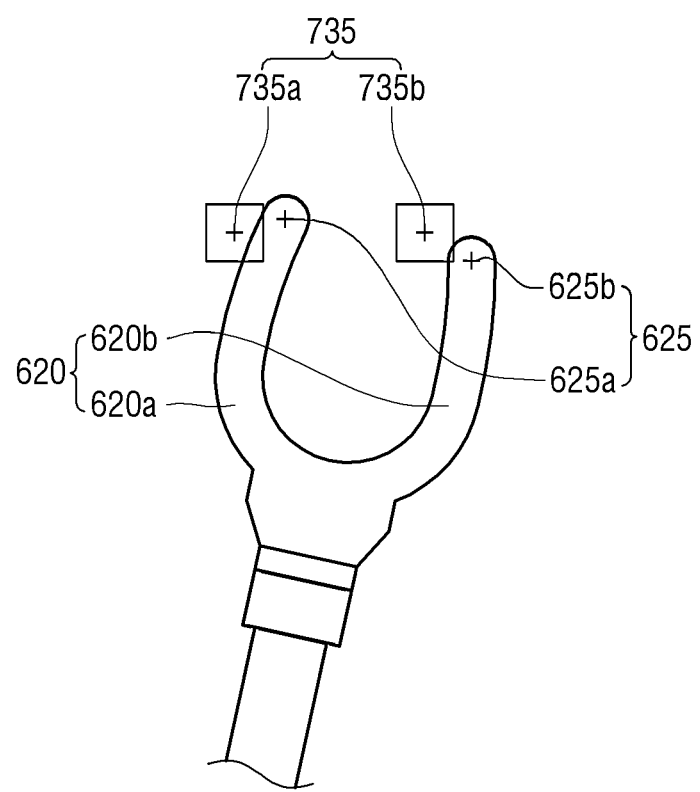

FIGS. 11 and 12 are diagrams for describing step S500 of FIG. 5.

Referring to FIGS. 5, 11 and 12, the robot hand 620 may be aligned (S500).

"Aligned" may mean that the coordinates of the reference point 735 of the teaching plate 730 coincide with the coordinates of the alignment mark 625 of the robot hand 620. For example, if the coordinates of the reference point 735 of the teaching plate 730 are (0,0), the robot hand 620 can be considered as being aligned when the coordinates of the alignment marks 625 of the robot hand 620 are (0,0).

Specifically, the robot hand 620 may be aligned using the camera 720. For example, the first camera 720a may align the first hand 620a by comparing the first reference point 735a with the first alignment mark 625a. The second camera 720b may align the second hand 620b by comparing the second reference point 735b with the second alignment mark 625b.

In some embodiments, the vertical height between the camera 720 and the robot hand 620 may be the second height H2. The second height H2 may be the same as the first height H1. That is, as the first height H1 when the camera 720 captures the reference point 735 and the second height H2 when the camera 720 aligns the robot hand 620 are the same, it is possible to align the robot hand 620 more precisely.

In FIG. 12, the reference point 735 and the robot hand 620 are not aligned. The first hand 620a may be aligned by comparing the first reference point 735a with the first alignment mark 625a. The second hand 620b may be aligned by comparing the second reference point 735b with the second alignment mark 625b. The robot hand 620 may be aligned by aligning the first hand 620a and the second hand 620b. In this case, if the robot hand 620 is rotated counterclockwise, the robot hand 620 may be aligned. However, the technical spirit of the present disclosure is not limited thereto. Of course, the robot hand 620 may be aligned by moving in the x-direction or the y-direction.

Using the substrate treating apparatus according to some embodiments, the robot hand 620 may be aligned using an automated process. Due to this, it is possible to align the robot hand 620 more efficiently and accurately.

Although embodiments of the present disclosure have been described with reference to the above and the accompanying drawings, those skilled in the art, to which the present disclosure pertains, can understand that the present disclosure may be practiced in other specific forms without changing its technical spirit or essential features. Therefore, it should be understood that the embodiments described above are illustrative in all respects and not limiting.

What is claimed is:

1. An apparatus for treating a substrate comprising:
   a process chamber having a treating space therein;
   a transfer robot comprising a robot hand for loading and unloading a substrate into and out of the treating space and gripping the substrate; and
   a teaching buffer for aligning the robot hand, wherein the teaching buffer comprises a teaching plate for providing a reference point, and at least one camera looking at the teaching plate, wherein the camera captures the reference point of the teaching plate, wherein the transfer robot aligns the robot hand with the reference point in a same line perpendicular to the teaching plate using the camera, and wherein the reference point is captured at a first position, and the robot hand is aligned in the first position.

2. The apparatus of claim 1, wherein the robot hand comprises an alignment mark disposed at a distal end of the robot hand, wherein the teaching buffer compares the alignment mark with the reference point to align the robot hand.

3. The apparatus of claim 2, wherein the alignment mark is aligned with a center point of the substrate.

4. The apparatus of claim 1, wherein a distance between the teaching plate and the camera is the same as a distance between the robot hand and the camera.

5. The apparatus of claim 1, wherein the camera comprises a prism method.

6. The apparatus of claim 1, wherein the camera comprises a first camera and a second camera spaced apart from each other.

7. The apparatus of claim 6, wherein the reference point comprises a first reference point and a second reference point spaced apart from each other, wherein the first camera captures the first reference point, and the second camera captures the second reference point.

8. The apparatus of claim 7, wherein the robot hand comprises a first hand and a second hand spaced apart from each other, wherein the first hand is aligned with the first reference point and the second hand is aligned with the second reference point.

9. An apparatus for treating a substrate comprising:
a process chamber having a treating space therein;
a transfer robot comprising a first hand and a second hand for loading and unloading a substrate into and out of the treating space and gripping the substrate; and
a teaching buffer for aligning the first hand and second hand,
wherein the teaching buffer comprises a teaching plate for providing a first reference point and a second reference point, a first camera for capturing the first reference point and a second camera for capturing the second reference point,
wherein the transfer robot aligns the first hand using the first reference point and aligns the second hand using the second reference point such that the first and second reference points of the teaching plate and the first and second hands of the transfer robot are aligned in a same line perpendicular to the teaching plate, respectively.

10. The apparatus of claim 9, wherein the first hand comprises a first alignment mark disposed at a distal end of the first hand, wherein the first hand is aligned by comparing the first alignment mark with the first reference point.

11. The apparatus of claim 9, wherein a distance between the first camera and the first reference point is the same as a distance between the first hand and the first camera, wherein a distance between the second camera and the second reference point is the same as a distance between the second camera and the second hand.

12. The apparatus of claim 9, wherein a first vertical position, at which the first and second reference points are captured, and a second vertical position, at which the first and second hands are aligned, are the same as each other.

13. The apparatus of claim 9, wherein the camera comprises a prism method.

14. A method for treating a substrate comprising:
loading a teaching plate comprising a reference point into a teaching buffer;
capturing the reference point using a camera disposed in an upper portion of the teaching plate;
loading a robot hand comprising an alignment mark into the teaching buffer; and
aligning the robot hand by comparing the reference point and the alignment mark such that the reference point of the teaching plate and the alignment mark of the robot hand are aligned in a same line perpendicular to the teaching plate,
wherein the robot hand grips a substrate to load and unload the substrate into and out of a process chamber, and
wherein a position, at which the teaching plate is loaded, and a position, at which the robot hand is loaded, are the same as each other.

15. The method of claim 14, wherein the alignment mark is aligned with a center point of the substrate.

16. The method of claim 14, wherein the camera comprises a first camera and a second camera spaced apart from each other, wherein the reference point comprises a first reference point and a second reference point spaced apart from each other, wherein the first camera captures the first reference point, and the second camera captures the second reference point.

17. The method of claim 16, wherein the robot hand comprises a first hand and a second hand spaced apart from each other, wherein the first hand is aligned with the first reference point and the second hand is aligned with the second reference point.

18. The method of claim 14, wherein the camera comprises a prism method.

* * * * *